United States Patent
Chen et al.

(10) Patent No.: US 11,768,276 B2
(45) Date of Patent: Sep. 26, 2023

(54) LASER EMITTING CIRCUIT AND LIDAR

(71) Applicant: SUTENG INNOVATION TECHNOLOGY CO., LTD., Shenzhen (CN)

(72) Inventors: Junlin Chen, Shenzhen (CN); Wenbin Rui, Shenzhen (CN)

(73) Assignee: SUTENG INNOVATION TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 17/843,964

(22) Filed: Jun. 18, 2022

(65) Prior Publication Data

US 2022/0317251 A1    Oct. 6, 2022

Related U.S. Application Data (63) Continuation of application No. PCT/CN2019/127055, filed on Dec. 20, 2019.

(51) Int. Cl.
| | | |
|---|---|---|
| *G01S 7/484* | (2006.01) | |
| *H01S 5/042* | (2006.01) | |
| *G01S 7/481* | (2006.01) | |

(52) U.S. Cl.
CPC .......... *G01S 7/484* (2013.01); *H01S 5/0428* (2013.01); *G01S 7/4814* (2013.01)

(58) Field of Classification Search
CPC ........ G01S 17/10; G01S 7/484; G01S 7/4814; H01S 5/0428
See application file for complete search history.

(56) References Cited

U.S. PATENT DOCUMENTS

| | | | | |
|---|---|---|---|---|
| 9,368,936 | B1* | 6/2016 | Lenius | G01S 17/10 |
| 9,603,210 | B1* | 3/2017 | Carlen | H05B 45/56 |
| 2003/0063480 | A1* | 4/2003 | Morita | H02M 1/34 |
| | | | | 363/37 |
| 2009/0161710 | A1* | 6/2009 | Hoashi | G01S 7/4815 |
| | | | | 372/38.02 |
| 2017/0085057 | A1* | 3/2017 | Barnes | H01S 5/0428 |
| 2018/0076808 | A1* | 3/2018 | Singer | H03K 17/005 |
| 2018/0323576 | A1 | 11/2018 | Crawford et al. | |
| 2019/0229493 | A1 | 7/2019 | Stern | |

FOREIGN PATENT DOCUMENTS

WO    2019167039 A1    9/2019

OTHER PUBLICATIONS

Extended European Search Report issued in related European Application No. 19946147.6, dated Dec. 1, 2022, 5 pages.

* cited by examiner

*Primary Examiner* — Sang H Nguyen
(74) *Attorney, Agent, or Firm* — BAYES PLLC (57) ABSTRACT

The present application discloses a laser emitting circuit and a LiDAR. In a one-driving-multiple emitting circuit, in an energy storage stage, a power supply stores energy for an energy storage element of the energy storage circuit, and a laser diode does not emit light. In an energy transfer stage, by setting a floating-ground diode D0, an energy charging current passes through an energy storage capacitor C2, the floating-ground diode D0 and the ground to form a loop. In an energy release stage, when the energy release switch element is in an off state, the energy release circuit where the energy release switch element is located is not the lowest impedance loop. A laser diode in the energy release circuit where the energy release switch element is located does not emit light.

10 Claims, 5 Drawing Sheets

LASER EMITTING CIRCUIT AND LIDAR

CROSS-REFERENCE TO RELATED APPLICATION

The present application is a continuation of International Application No. PCT/CN2019/127055, filed on Dec. 20, 2019, the content of which is incorporated herein by reference in its entirety.

TECHNICAL FIELD

This application relates to the field of a laser circuit, and in particular, to a laser emitting circuit and LiDAR.

BACKGROUND

For a LiDAR, a laser emitting circuit is used to emit laser. The working process of the laser emitting circuit is generally divided into three stages: an energy charging stage, an energy transfer stage, and an energy releasing stage. The energy charging stage includes charging an energy storage element and storing electrical energy in the energy storage element. The energy transfer stage includes transferring electrical energy stored in the energy storage element to an energy transfer element after the energy charging stage is completed. The energy releasing stage includes releasing the electrical energy stored in the energy transfer element to drive a laser diode to emit laser after the transfer of the electrical energy is completed. The inventor found that in a one-driving-multiple emitting circuit in the related art, the phenomenon that the laser diode emits light at an unexpected time may occur, which affects a performance of the LiDAR.

SUMMARY

Embodiments of the present application provide a laser emitting circuit and a LiDAR to solve the problems in the related art that the laser emitting circuit emits laser at an unexpected time and consequently affects a measurement performance.

Technical solutions are as follows:

In a first aspect, an embodiment of this application provides a laser emitting circuit, including:

an energy charging circuit, an energy transfer circuit and a plurality of energy release circuits, and the plurality of energy release circuits are connected in parallel, wherein the energy charging circuit is connected to the energy transfer circuit to store electric energy;

the energy transfer circuit is connected to the energy charging circuit and the energy release circuit to transfer the electric energy stored in the energy charging circuit to the energy transfer circuit, and the energy transfer circuit includes an energy storage capacitor and a floating-ground diode, wherein a first terminal of the energy storage capacitor is connected to the energy charging circuit; the first terminal of the energy storage capacitor is connected to the energy release circuit; a second terminal of the energy storage capacitor is grounded by the floating-ground diode; and the second terminal of the energy storage capacitor is connected to the energy release circuit; and the energy release circuit is configured to drive the laser diode to emit light by using the electric energy stored in the energy transfer circuit, and the energy release circuit includes an energy release switch element, the laser diode and a clamping diode, wherein a first switch terminal of the energy release switch element is connected to the first terminal of the energy storage capacitor, and a second switch terminal of the energy release switch element is connected to a positive electrode of the clamping diode and a positive electrode of the laser diode, wherein a negative electrode of the clamping diode is grounded and a negative electrode of the laser diode is connected to the second terminal of the energy storage capacitor.

In a second aspect, an embodiment of this application provides a LiDAR, including the foregoing laser emitting circuit.

The beneficial effects provided by the technical solutions of some embodiments of the present application include at least:

In the LiDAR that drives a plurality of energy release circuits, in an energy storage stage, a power supply stores energy for an energy storage element of an energy storage circuit, and both a switch element Q0 and energy release switch elements Q1~Qn are controlled to be in an off state, and the laser diode does not emit light. In an energy transfer process, by setting a floating-ground diode D0, an energy transfer current passes through the energy storage capacitor C2, the floating-ground diode D0 and the ground to form a loop. Meanwhile, by setting a clamping diode between a positive electrode of a laser diode in each energy release circuit and the ground, the positive electrode of the clamping diode is connected to the positive electrode of the laser diode and the negative electrode of the clamping diode is grounded, so that a current generated by a parasitic capacitor of the energy release switch elements Q1~Qn is bypassed to the ground, thereby avoiding that each laser diode emits light in an energy transfer stage. In an energy release stage, part of the plurality of the energy release switch elements are in an off state. The energy release circuit where the switch element in an off state is located is not the lowest impedance loop. Therefore, the laser diode in the energy release circuit where the energy release switch element in an off state is located does not emit light. A situation that the laser diode emitting light at an unexpected time will not occur. Therefore, the embodiment of the present application can prevent the laser diode in the one-driving-multiple emitting circuit from emitting light at an unexpected time, and improve a measurement performance of the LiDAR.

BRIEF DESCRIPTION OF DRAWINGS

To explain embodiments of the present application or the technical solutions in the related art more clearly, the following briefly introduces the drawings that need to be used in the embodiments or the related art. Obviously, the drawings in the following description are only some embodiments of the present application. The person skilled in the art may obtain other drawings based on these drawings without creative efforts.

DETAILED DESCRIPTION

To make objectives, technical solutions and advantages of the present application clearer, embodiments of the present application are described in further detail below with reference to the drawings.

Figure 1:
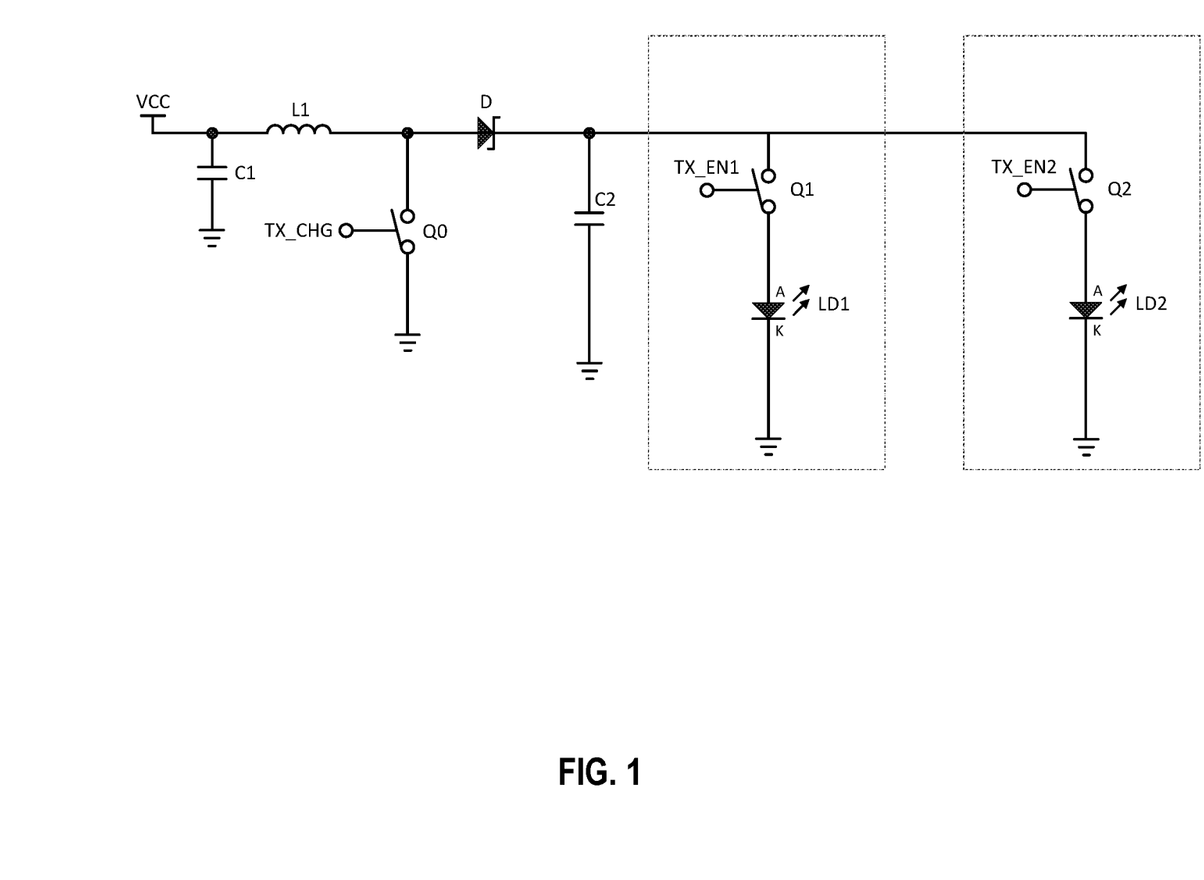
FIG. 1 is a schematic structural diagram of a laser emitting circuit in the related art according to an embodiment of this application.

FIG. 1 shows a schematic structural diagram of a one-driving-multiple laser emitting circuit in the related art. The one-driving-multiple laser emitting circuit includes a plurality of energy release circuits connected in parallel. A working process of the laser emitting circuit is divided into three stages: a charging stage, an energy transfer stage, and an energy release stage. Three stages of the laser emitting circuit including two energy release circuits (as shown by a dotted line box in the figure) are described in detail below.

An energy charging stage: an enabling terminal TX_CHG of a switch element Q0 is connected to a pulse generator. The pulse generator sends a rectangular pulse to control an on or off state of the switch element Q0. The pulse generator sends a rectangular pulse to an enabling terminal TX_EN1 of a switch element Q1 to control an on or off state of the switch element Q1. The pulse generator sends the rectangular pulse to an enabling terminal TX_EN2 of a switch element Q2 to control an on or off state of the switch element Q2. When the switch element Q0 is in an on state, and both the switch element Q1 and the switch element Q2 are in an off state, the laser emitting circuit is in the energy charging stage. A current generated by a power supply VCC passes through an inductor L1 and the switch element Q0 to form a loop and charge the inductor L1. It is assumed that an on-time of the switch element Q0 is Δt (Δt is also called energy charging time), and then a current increment in the inductor L1 follows a formula: $\Delta I = (V_{CC} \times \Delta t)/L_1$ (Formula 1).

Where $V_{CC}$ in Formula 1 represents a voltage value of the power supply VCC, and $L_1$ represents an inductance value of the inductor L1.

Charged energy follows a formula:

$$W_L = \frac{1}{2} \times L_1 \times \Delta I^2. \quad \text{(Formula 2)}$$

Formula 1 is substituted into Formula 2 to obtain $$W_L = \frac{1}{2} \times \frac{(V_{CC} \times \Delta t)^2}{L_1}. \quad \text{(Formula 3)}$$

According to Formula 3, it can be seen that the charged energy $W_L$ is inversely proportional to an inductance value $L_1$, and is directly proportional to a square of the on-time Δt of the switch element Q0. When keeping the charged energy $W_L$ unchanged, if the on-time of the switch Q0 is reduced, the inductance value of the inductor L1 needs to be reduced.

It can be seen from Formula 1 and Formula 2 that the pulse generator can control a width of the rectangular pulses to control the on-time of the switch element Q0, that is, control an energy charging time of the inductor L1, thereby changing an amount of the charged energy and adjusting an emitting power of laser.

An energy transfer stage: when the switch element Q0 is in an off state and both the switch element Q1 and the switch element Q2 are also in an off state, the laser emitting circuit is in the energy transfer stage. Because the current of the inductor L1 cannot change suddenly, the charged electrical energy is stored in the inductor L1. The inductor L1 charges an energy storage capacitor C2 via a boost rectifier diode D so that the charged electrical energy stored in the inductor L1 can be transferred to the energy storage capacitor C2.

Although the switch element Q0, the switch element Q1, and the switch element Q2 are in an off state, a parasitic capacitor is provided between two switch terminals of each foregoing switch element. The parasitic capacitor between the two switch terminals of the switch element Q0 is provided as $C_{Q0-DS}$. The parasitic capacitor between the two switch terminals of the switch element Q1 is provided as $C_{Q1-DS}$. The parasitic capacitor between the two switch terminals of the switch element Q2 is provided as $C_{Q2-DS}$.

Then a current increment ΔI of the inductor L1 is shunted via the following branches:

Loop 1: a current flows from the inductor L1 through the parasitic capacitor $C_{Q0-DS}$ to the ground GND to form a loop. The current in this loop is defined as $I_{CQ0}$.

Loop 2: a current flows from the inductor L1 through the boost rectifier diode D and the energy storage capacitor C2 to the ground GND to form a loop. The current in this loop is defined as $I_{C2}$.

Loop 3: a current flows from the inductor L1 through the boost rectifier diode D and the parasitic capacitor $C_{Q1-DS}$, and the laser diode LD1 to the ground GND to form a loop, and the current is defined as $I_{CQ1}$.

Loop 4: a current flows from the inductor L1 through the boost rectifier diode D, the parasitic capacitor $C_{Q2-DS}$, and the laser diode LD2 to the ground to form a loop. The current is defined as $I_{CQ2}$.

Only the loop 2 of the foregoing four loops is a main energy charging loop, which realizes an energy storage function of the energy storage capacitor C2. In the energy transfer stage, the switch element Q0 is in an off state, but the loop 1 is formed due to an effect of a parasitic capacitor of the switch element Q0. The switch element Q1 is in an off state, but the loop 3 is formed due to an effect of a parasitic capacitor of the switch element Q1. The switch element Q2 is in an off state, but the loop 4 is formed due to an effect of a parasitic capacitor of the switch element Q2. In the loop 3 and the loop 4, if the current in the loop is greater than the light emitting threshold current of the laser diode, the laser diode LD1 and the laser diode LD2 emit light during the energy transfer phase, that is, emit light at an unexpected time, thereby affecting the measurement performance of the LiDAR.

An energy release stage: when the switch element Q0 is in an off state, and one or both of the switch element Q1 and the switch element Q2 are in an on state, the laser emitting circuit is in the energy release stage. The present application examines a process in which one switch element Q1 is in an on state and the switch element Q2 is in an off state, that is, only the light emitting diode LD1 is required to emit light. Energy stored in the energy storage capacitor C2 passes through the switch element Q1 and the laser diode LD1 to the ground GND to form a loop and drive the laser diode LD1 to emit lasers. However, because the switch element Q2 is in an off state, the laser diode LD2 does not emit light.

Figure 2:
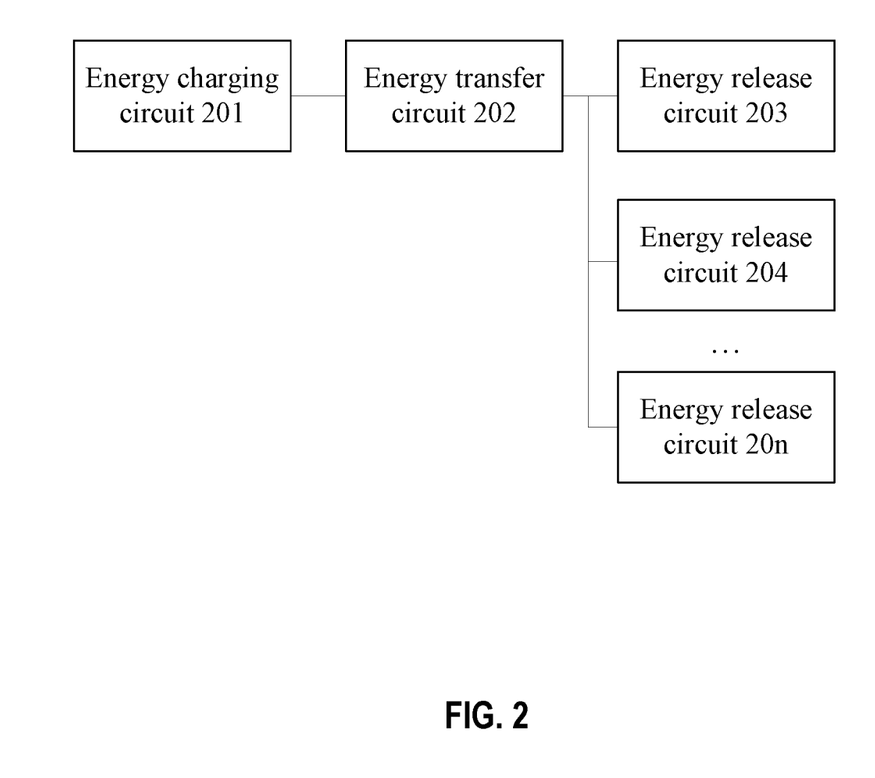
FIG. 2 is a block diagram of a laser emitting circuit according to an embodiment of this application.

In order to solve a problem that the laser diode emits light at an unexpected time in the energy transfer stage, the embodiment of the present application provides a laser emitting circuit. As shown in FIG. 2, the laser emitting circuit of the embodiment of the application includes: an energy charging circuit 201, an energy transfer circuit 202, and a plurality of energy release circuits. The plurality of energy release circuits are an energy release circuit 203, an energy release circuit 204, . . . , and an energy release circuit 20n, where n is an integer greater than or equal to 4. The number of the plurality of energy release circuits is not limited to seven (when n=9). For example, when n=10, the energy release circuit 2010 is the eighth energy release circuit in the laser emitting circuit. The plurality of energy release circuits are connected in parallel, that is, each energy release circuit and the energy transfer circuit 202 can have the same connection mode. The energy charging circuit 201 is connected to the energy transfer circuit 202, and the energy transfer circuit 202 is connected to the energy release circuits 203-20n. The energy charging circuit 201 is configured to store electrical energy. The energy transfer circuit 202 is configured to transfer and store the electrical energy stored in the energy charging circuit 201 to the energy transfer circuit. The energy release circuits 203-20n are configured to drive the laser diode to emit light by using electrical energy stored in the energy transfer circuit 202.

Figure 3A:
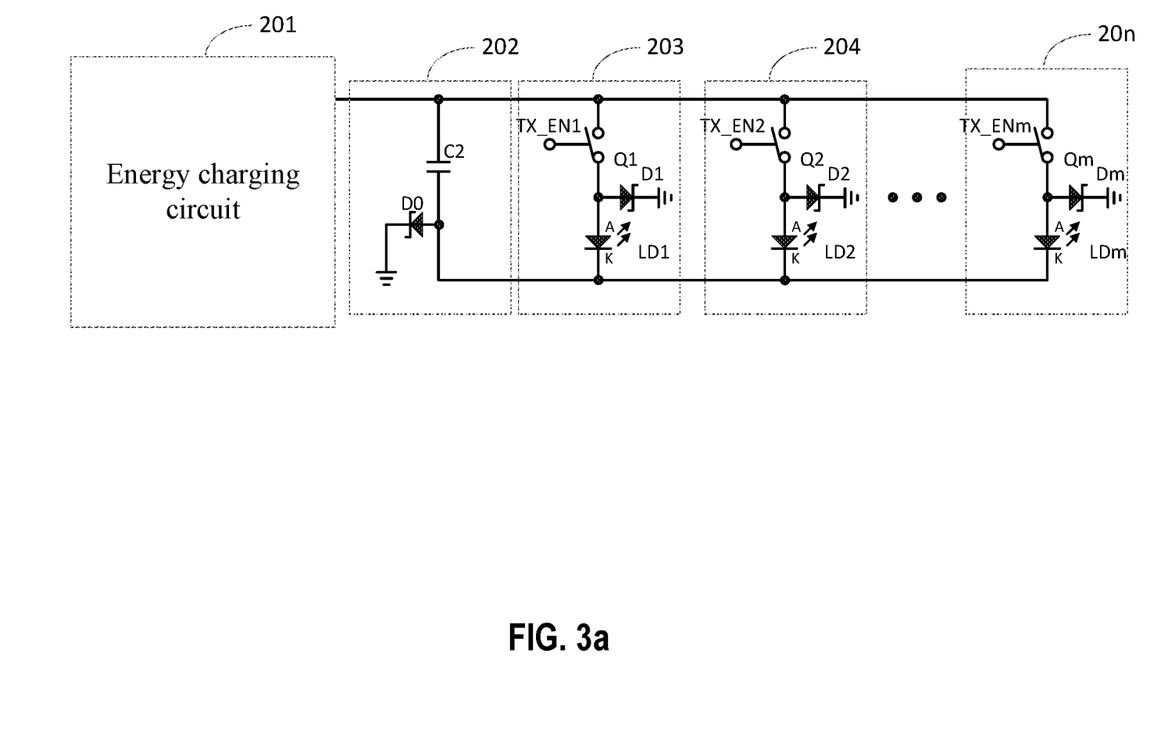
FIG. 3a is another schematic structural diagram of a laser emitting circuit according to an embodiment of this application.

FIG. 3a is a schematic structural diagram of a laser emitting circuit of the embodiment of the present application.

The laser emitting circuit includes an energy charging circuit 201, an energy transfer circuit 202, and energy release circuits 203-20n. The energy transfer circuit 202 includes an energy storage capacitor C2 and a floating-ground diode D0. The energy release circuit 203 includes an energy release switch element Q1, a laser diode LD1, and a clamping diode D1. The energy release switch element Q1 includes two switch terminals and an enabling terminal TX_EN1. The energy release circuit 204 includes an energy release switch element Q2, a laser diode LD2, and the clamping diode D1. The energy release switch element Q2 includes two switch terminals and one enabling terminal TX_EN2. The energy release circuit 20n includes an energy release switch element Qm, a laser diode LDm and a clamping diode Dm. The energy release switch element Qm includes two switch elements and an enabling terminal TX_ENm.

The energy release switch element therein may be a BJT (Bipolar Junction Transistor), for example, an IGBT (Insulated Gate Bipolar Transistor). The energy release switch element can also be a MOSFET (Metal-Oxide-Semiconductor Field-Effect Transistor), for example, a GaN (Gallium nitride) switch tube.

A connection relationship between the energy charging circuit 201 and the energy transfer circuit 202 is as follows: the energy charging circuit 201 is connected to a first terminal of the energy storage capacitor C2; a second terminal of the energy storage capacitor C2 is connected to a positive electrode of the floating-ground diode D0, and a negative electrode of the floating-ground diode D0 is grounded.

A connection relationship between the energy transfer circuit 202 and the energy release circuit 203 is as follows: the first terminal of the energy storage capacitor C2 is connected to a first switch terminal of the energy release switch element Q1; a second switch terminal of the energy release switch element Q1 is connected to a positive electrode of the clamping diode D1; the second switch terminal of the energy release switch element Q1 is connected to a positive electrode of the laser diode LD1; a negative electrode of the clamping diode D1 is grounded, and a negative electrode of the laser diode LD1 is connected to the positive electrode of the floating-ground diode D0. Because the energy release circuits 203-20n are connected in parallel, connection relationships between each energy release circuit and the energy transfer circuit 202 can be the same. For details, please refer to a connection relationship between the energy release circuit 203 and the energy transfer circuit 202, which is not repeated here.

Figure 3B:
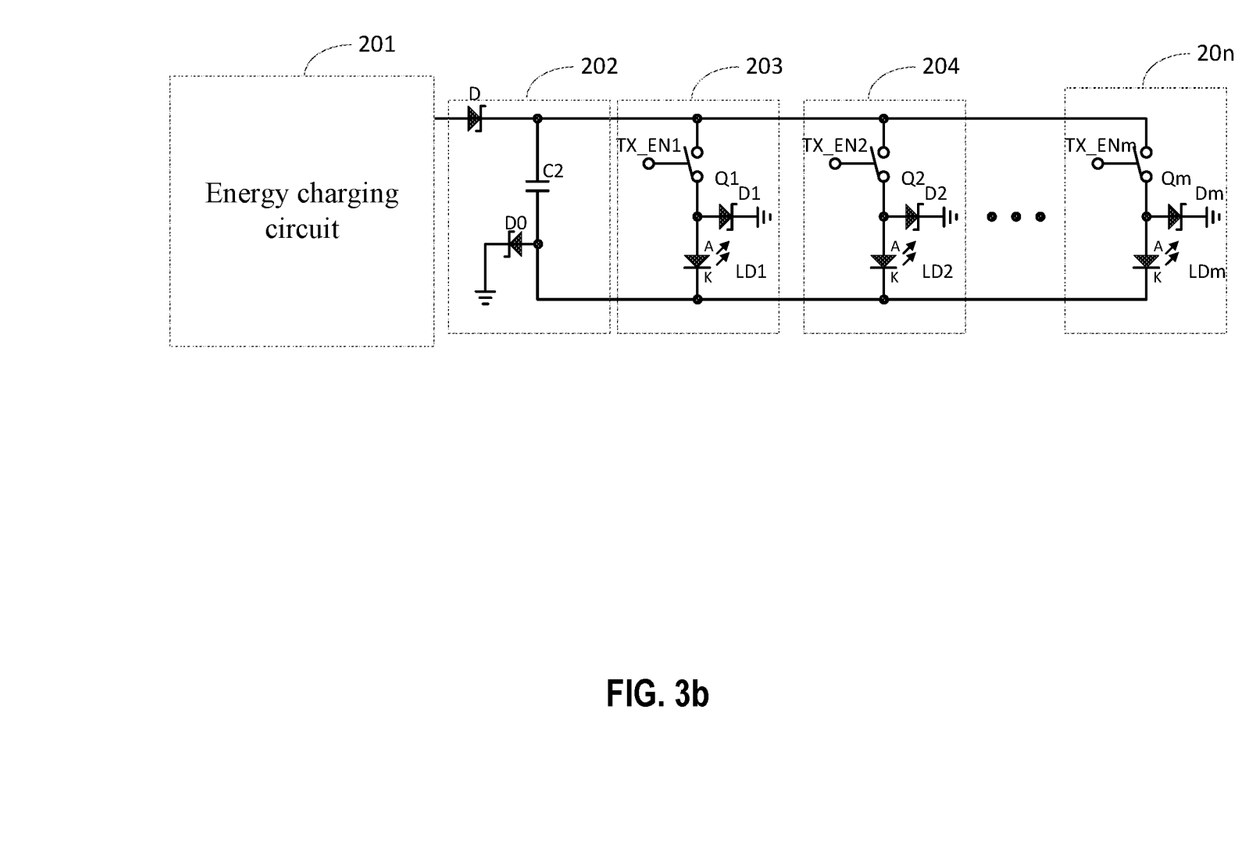
FIG. 3b is a schematic structural diagram of a laser emitting circuit according to an embodiment of this application.

Optionally, as shown in FIG. 3b, the energy transfer circuit 202 further includes a boost rectifier diode D. A positive electrode of the boost rectifier diode D is connected to the energy charging circuit 201. A negative electrode of the boost rectifier diode D is connected to the first terminal of the energy storage capacitor C2. The boost rectifier diode D has a unidirectional conduction function, which avoids a reverse discharge of the energy storage capacitor C2 in the energy transfer stage and the energy release stage, causing a backflow of electrical energy in the energy storage capacitor C2, resulting in the leakage of electrical energy in the energy storage capacitor C2. It can be understood that the boost rectifier diode D may be a Schottky diode.

The working process of the laser emitting circuit in FIG. 3b includes:

In an energy charging stage, the energy storage element in the energy charging circuit 201 stores the electrical energy supplied by a power supply, and an energy charging action is completed.

In the energy transfer stage, the energy release switch elements Q1-Qm are in an off state, that is, two switch terminals of the energy release switch element are disconnected. The energy charging circuit 201 charges the energy transfer circuit 202 by using the stored electrical energy, specifically, transfers the electrical energy to the energy storage capacitor C2. In the energy transfer stage, a charging current passes through the boost rectifier diode D, the energy storage capacitor C2, the floating-ground diode D0, and the ground to form a loop. The energy release switch elements Q1-Qm are all in an off state. Due to the presence of the clamping diodes D1-Dm, a leakage current passing through parasitic capacitors of the energy release switch elements Q1-Qm does not pass through the laser diodes LD1-LDm, so that the laser diodes in the energy release circuits 203-20n do not emit light at an unexpected time during the energy transfer process.

In the energy release stage, when a part of the laser diodes in the laser emitting circuit need to emit light, and the other part of the laser diodes do not need to emit light, for example, when the laser diode LD1 needs to emit light and the laser diodes LD2-LDm do not need to emit light, the switch element Q1 is in an on state, the switch elements Q2-Qm are in an off state, and electrical energy stored in the energy storage capacitor C2 returns to the second terminal of the energy storage capacitor via two switch terminals of the energy release switch element Q1 and the laser diode LD1 to form an energy release loop and drive the laser diode LD1 to emit light. For any one of the laser diodes LD2-LDm, because the switch elements Q2-Qm are in an off state and it is not the lowest impedance loop of the energy release circuit, a loop cannot be formed between the laser diodes LD2-LDm and the energy storage capacitor C2, and the laser diodes LD2-LDm do not work. Therefore, laser diodes in the energy release circuits 203-20n do not emit light at an unexpected time.

In one or more embodiments, in any energy release circuit, the energy release switch element is a BJT. A collecting electrode of the BJT is connected to the first terminal of the energy storage capacitor C2. An emitting electrode of the BJT is connected to the positive electrode of the clamping diode. The emitting electrode of the BJT is connected to the positive electrode of the laser diode. A base electrode of the BJT is connected to a pulse generator as the enabling terminal. The pulse generator can send out pulse signals, such as rectangular pulse signals, to control the collecting electrode and the emitting electrode of the BJT to be in an on state when the rectangular pulse signals are at a high level, and to control the collecting electrode and the emitting electrode of the BJT to be in an off state when the rectangular pulse signals are at a low level. A duration of the high level of the rectangular pulse signals is an on-time of the BJT.

In one or more embodiments, in any energy release circuit, the energy release switch element is a BJT. The emitting electrode of the BJT is connected to the first terminal of the energy storage capacitor C2. The collecting electrode of the BJT is connected to the positive electrode of the clamping diode. The collecting electrode of the BJT is connected to the positive electrode of the laser diode. The base electrode of the BJT is connected to the pulse generator as the enabling terminal. The pulse generator can send the pulse signals, such as the rectangular pulse signals, to control the collecting electrode and the emitting electrode of the BJT to be in an off state when the rectangular pulse signals are at the high level, and to control the collecting electrode and the emitting electrode of the BJT to be in an on state when the rectangular pulse signals are at the low level. A duration of the low level of the rectangular pulse signals is the on-time of the BJT.

In one or more embodiments, in any energy release circuit, the energy release switch element is a MOSFET. A source electrode of the MOSFET is connected to the first terminal of the energy storage capacitor C2. A drain electrode of the MOSFET is connected to the positive electrode of the clamping diode. The drain electrode of the MOSFET is connected to the positive electrode of the laser diode. A grid electrode of the MOSFET is connected to the pulse generator as the enabling terminal. The pulse generator can send out the pulse signals, such as the rectangular pulse signals, to control the on or off state of the source electrode and the drain electrode of the MOSFET. A duration of the rectangular pulse signals is an on-time of the MOSFET.

In one or more embodiments, in any energy release circuit, the energy release switch element is a MOSFET. A drain electrode of the MOSFET is connected to the first terminal of the energy storage capacitor C2. A source electrode of the MOSFET is connected to the positive electrode of the clamping diode. The source electrode of the MOSFET is connected to the positive electrode of the laser diode. The grid electrode of the MOSFET is connected to the pulse generator as the enabling terminal. The pulse generator can send the pulse signals, such as the rectangular pulse signals, to control the on or off state of the source electrode and the drain electrode of the MOSFET. The duration of the rectangular pulse signals is the on-time of the MOSFET.

In one or a plurality of embodiments, the energy charging circuit includes a power supply, a decoupling capacitor, an inductor, and an energy charging switch element. The power supply is a DC power supply. A positive electrode of the power supply is connected to a first terminal of the inductor. A second terminal of the inductor is grounded via an energy charging switch element, and the second terminal of the inductor is connected to the first terminal of the energy storage capacitor C2. The decoupling capacitor is configured to eliminate parasitic coupling between the circuits. When the energy charging switch element is in an on state, the power supply charges the inductor, and after charging is completed, the inductor stores electrical energy. The energy charging switch element can be a GaN switch tube, a MOSFET, or an IGBT.

Further, the energy charging switch element is a BJT. A collecting electrode of the BJT is connected to the first terminal of the energy storage capacitor. An emitting electrode of the BJT is connected to the positive electrode of the clamping diode. The emitting electrode of the BJT is connected to the positive electrode of the laser diode. The base electrode of the BJT is connected to the pulse generator as an enabling terminal. The pulse generator sends the pulse signals to the enabling terminal of the BJT, for example, the rectangular pulse signals. When the rectangular pulse signals are in the high level, the BJT is in an on state. When the rectangular pulse signals are in the low level, the BJT is in an off state.

Alternatively, the energy charging switch element is a BJT. An emitting electrode of the BJT is connected to the first terminal of the energy storage capacitor. A collecting electrode of the BJT is connected to the positive electrode of the clamping diode. The collecting electrode of the BJT is connected to the positive electrode of the laser diode. The base electrode of the BJT is connected to the pulse generator as an enabling terminal. The pulse generator sends the rectangular pulse signals to the enabling terminal of the BJT. When the rectangular pulse signals are in the high level, the BJT is in an off state. When the rectangular pulse signals are in the low level, the BJT is in an on state.

Alternatively, the energy charging switch element is a MOSFET. A source electrode of the MOSFET is connected to the first terminal of the energy storage capacitor. A drain electrode of the MOSFET is connected to the positive electrode of the clamping diode. The drain electrode of the MOSFET is connected to the positive electrode of the laser diode. A grid electrode of the MOSFET is connected to the pulse generator as an enabling terminal. The pulse generator sends the pulse signals to the enabling terminal of the MOSFET, for example, the rectangular pulse signals. When the rectangular pulse signals are in the high level, the MOSFET is in an on state. When the rectangular pulse signals are in the low level, the MOSFET is in an off state.

Alternatively, the energy charging switch element is a MOSFET. A drain electrode of the MOSFET is connected to the first terminal of the energy storage capacitor. A source electrode of the MOSFET is connected to the positive electrode of the clamping diode. The source electrode of the MOSFET is connected to the positive electrode of the laser diode. A grid electrode of the MOSFET is connected to the pulse generator as the enabling terminal. The pulse generator sends the rectangular pulse signals to the enabling terminal of the MOSFET. When the rectangular pulse signals are in the high level, the MOSFET is in an off state. When the rectangular pulse signals are in the low level, the MOSFET is in an on state.

In one or a plurality of embodiments, for each energy release circuit, the energy release circuit further includes a dynamic compensation capacitor. The dynamic compensation capacitor is connected across two terminals of the energy release switch element. The dynamic compensation capacitor is connected across the two switch terminals of the energy release switch element. The dynamic compensation capacitor can suppress current resonance caused by parasitic parameters of an electric discharge loop of the energy storage capacitor C2, and can supplement dynamic impedance when the energy releasing switch element is turned on.

In one or a plurality of embodiments, a capacitance value of the dynamic compensation capacitor is smaller than that of the energy storage capacitor.

In one or a plurality of embodiments, the energy storage capacitor C2 can be formed by connecting a plurality of capacitors in parallel to reduce the ESR (Equivalent Series Resistance) of the capacitor C2. It is understandable that the capacitance values of the plurality of capacitors may be equal or unequal. Preferably, the capacitance values of the plurality of capacitors connected in parallel are equal. The respective capacitors with the same capacitance value connected in parallel have better ESR consistency, and the electric discharge of the respective capacitors connected in parallel is more equal, which can better improve the efficiency of the energy storage element.

It is understandable that a grounding connection way of various elements in FIG. 3b (for example, the floating-ground diode, the laser diode, and the energy release switch element) can be changed and the various elements can be connected to a negative electrode of a power supply, which can also achieve the same function as the laser emitting circuit in FIG. 3b. It can be understood that the negative electrode of the power supply can be grounded.

Figure 4:
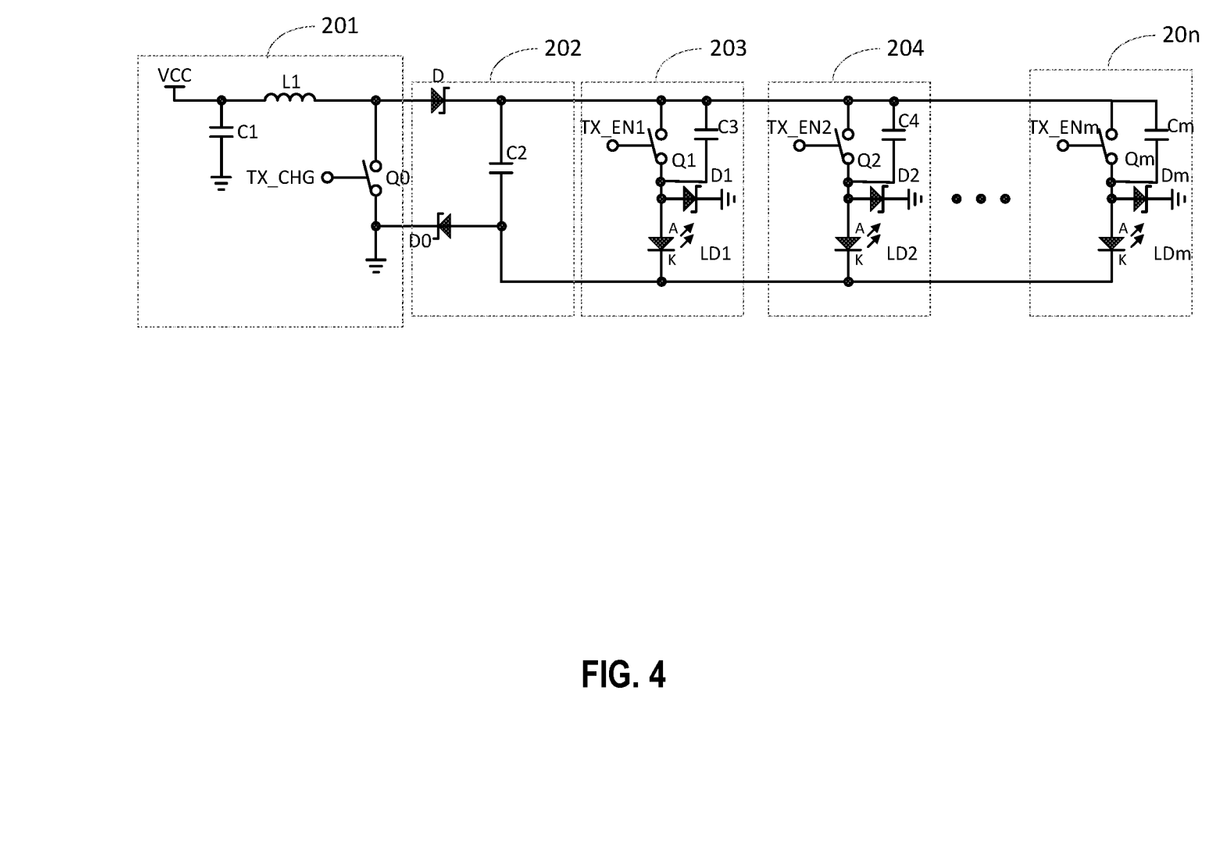
FIG. 4 is another schematic structural diagram of a laser emitting circuit according to an embodiment of this application.

Referring to FIG. 4, FIG. 4 is a specific schematic structural diagram of a laser emitting circuit provided by an embodiment of the present application. In the embodiment of the present application, the laser emitting circuit includes an energy charging circuit 201, an energy transfer circuit 202, energy release circuits 203-20n, where n is an integer greater than or equal to 4. The number of the energy release circuits is not limited to seven (when n=9). For example, when n=10, the energy release circuit 2010 is the eighth energy release circuit in the laser emitting circuit. The energy release circuit 203 is connected in parallel with the energy release circuit 20n. The energy charging circuit 201 includes a power supply VCC, a decoupling capacitor C1, an inductor L1, and an energy charging switch element Q0. The energy charging switch element Q0 includes two switch terminals and one enabling terminal TX_CHG. The energy transfer circuit 202 includes a boost rectifier diode D, a floating-ground diode D0, and an energy storage capacitor C2. The energy release circuit 203 includes an energy release switch element Q1, a dynamic compensation capacitor C3, a clamping diode D1, and a laser diode LD1. The energy release switch element Q1 includes two switch terminals and one enabling terminal TX_EN1.The energy release circuit 204 includes an energy release switch element Q2, a dynamic compensation capacitor C4, a clamping diode D2, and a laser diode LD2. The energy release switch element D2 includes two switch terminals and one enabling terminal TX_EN2 . . . . The energy release circuit 20n includes an energy release switch element Qm, a dynamic compensation capacitor Cm, a clamping diode Dm, and a laser diode LDm. The energy release switch element Qm includes two switch terminals and one enabling terminal TX_ENm, where m is an integer greater than or equal to 2.

Connection relationships of various elements in FIG. 4 are as follows: a positive electrode of the power supply VCC is connected to a first terminal of the decoupling capacitor C1. A negative electrode of the power supply VCC is grounded. A second terminal of the decoupling capacitor C1 is grounded. The second terminal of the decoupling capacitor C1 is connected to a first terminal of the inductor L1. A second terminal of the inductor L1 is connected to a positive electrode of the boost rectifier diode D. The second terminal of the inductor L1 is connected to a first switch terminal of the energy charging switch element Q0. A second switch terminal of the energy charging switch element Q0 is grounded. The second switch terminal of the energy charging switch element Q0 is connected to a negative electrode of the floating-ground diode D0. A negative electrode of the boost rectifier diode D is connected to a first terminal of the energy storage capacitor C2. A positive electrode of the floating-ground diode D0 is connected to a second terminal of the energy storage capacitor C2. Because the energy release circuits 203-20n are connected in parallel, connection relationships between each energy release circuit and the energy transfer circuit 202 can be the same. The connection relationship between the energy release circuit 203 and the energy transfer circuit 202 is used for illustration here. In the energy release circuit 203, the first terminal of the energy storage capacitor C2 is connected to a first switch terminal of the energy release switch element Q1. The second terminal of the energy storage capacitor C2 is connected to a negative electrode K of the laser diode LD1. A second switch terminal of the energy release switch element Q1 is connected to a positive electrode of the clamping diode D1 and a positive electrode A of the laser diode LD1. A negative electrode of the clamping diode D1 is grounded. A first terminal of the dynamic compensation capacitor C3 is connected to the first switch terminal of the energy release switch element Q1. A second terminal of the dynamic compensation capacitor C3 is connected to the second switch terminal of the energy release switch element Q1.

It is understandable that a grounding connection way of the various elements of FIG. 4 (for example, the decoupling capacitor C1, the floating-ground diode D0, the clamping diodes D1-Dm) can be changed and the various elements can be connected to the negative electrode of the power supply VCC, which can also achieve the same function as the function of the laser emitting circuit in FIG. 4. It is understandable that the negative electrode of the power supply VCC may be grounded.

For various energy release circuit, a capacitance value of the dynamic compensation capacitor is smaller than that of the energy storage capacitor C2. The capacitance value of the dynamic compensation capacitor can range from 2 pF to 10 nF. For example, the capacitance value of the dynamic compensation capacitor is 100 pF. A capacitance value of the energy storage capacitor C2 can range from 2 pF to 20 nF. For example, the capacitance value of the energy storage capacitor C2 is 2 nF. An inductance value of the inductor L1 can range from 10 nH to 100 μH. For example, the inductance value of the inductor L1 is 330 nH. A value range of the parameter value of the foregoing elements is only for reference, and an embodiment of the present application is not limited thereto.

The working process of the laser emitting circuit in FIG. 4 includes:

1. An Energy Charging Stage

A pulse generator sends rectangular pulse signals to an enabling terminal TX_CHG of the energy charging switch element Q0 to control the energy charging switch element Q0 to be in an on state. At this time, the energy release switch elements Q1 to Qm are in an off state. The power supply VCC charges the inductor L1. The decoupling capacitor C1 is connected across the positive electrode and the negative electrode of the power supply VCC to prevent the circuit from causing parasitic oscillation via a positive feedback path formed by the power supply VCC. The so-called decoupling is to prevent current fluctuations formed in a power supply circuit from affecting the normal operation of the circuit when the currents of front and rear circuits change. In other words, the decoupling circuit can effectively eliminate parasitic coupling between the circuits.

2. An Energy Transfer Stage

After energy charging is completed, the pulse generator stops sending the rectangular pulse signals to the energy charging switch element Q0. The energy charging switch element Q0 is in an off state. The energy release switch elements Q1-Qm are still in an off state at this time. Because a current of the inductor L1 cannot change abruptly, the inductor L1 continues an electric potential generated by $\Delta I$ to generate two currents via the boost rectifier diode D. One of the currents charges the energy storage capacitor C2 via the boost rectifier diode D. An energy charging current passes through the boost rectifier diode D, the energy storage capacitor C2, the floating-ground diode D0, and the ground to form a loop. During a charging process of the energy storage capacitor C2, the laser diodes LD1-LDm are in an off state due to a clamping effect of the clamping diodes D1-Dm. The other energy transfering and charging current passes through a parasitic capacitor of the energy charging switch element Q0 to the ground to form another loop. The foregoing two charging currents do not flow through the laser diode. The laser diodes LD1-LDm do not emit light.

3. An Energy Releasing Stage

When a part of the laser diodes in the laser emitting circuit need to emit light, and the other part of the laser diodes do not need to emit light, for example, when the laser diode LD1 needs to emit light and the laser diodes LD2-LDm do not need to emit light, the switch element Q1 is in an on state, the switch elements Q2-Qm are in an off state, and electrical energy stored in the energy storage capacitor C2 returns to the second terminal of the energy storage capacitor via two switch terminals of the energy release switch element Q1 and the laser diode LD1 to form an energy release loop and drive the laser diode LD1 to emit light. For any one of the laser diodes LD2-LDm, because the switch elements Q2-Qm are in an off state and it is not the lowest impedance loop of the energy release circuit, laser diodes in the energy release circuits 204-20n do not emit light at an unexpected time. In addition, the dynamic compensation capacitor C3 also forms an electric discharge loop via the two switch terminals of the energy release switch element Q1, and releases electrical energy stored during energy transfer, thereby compensating a dynamic impedance of the switch element Q1 when the switch element Q1 is switched off, which is ready for a next cycle of laser transmission.

An embodiment of this application further provides a LiDAR, including a foregoing laser emitting circuit.

Specifically, the foregoing laser emitting circuit can be applied to the LiDAR. In addition to the laser emitting circuit, the LiDAR can also include specific structures such as a power supply, a processing apparatus, an optical receiving apparatus, a rotating body, a base, a housing, and a human-computer interaction apparatus. It is understandable that the LiDAR can be a single-channel LiDAR, and includes a channel of the foregoing laser emitting circuit. The LiDAR can also be a multi-channel LiDAR, including a plurality of channels of the foregoing laser emitting circuits and a corresponding control system. The quantity of the laser emitting circuits can be determined according to actual needs.

In the foregoing LiDAR driving a plurality of energy release circuits, in an energy storage stage, the power supply stores energy for an energy storage element of the energy storage circuit to control a switch element Q0 and energy release switch elements Q1-Qm to be in an off state and a laser diode does not emit light. In an energy transfer stage, by setting a floating-ground diode D0, an energy charging current passes through an energy storage capacitor C2, the floating-ground diode D0, and the ground to form a loop. Meanwhile, by setting a clamping diode between a positive electrode of the laser diode in each energy release circuit and the ground, a current generated by a parasitic capacitor of the energy release switch elements Q1-Qm is bypassed to the ground, thereby avoiding that each laser diode emits light in the energy transfer stage. In an energy release stage, when the energy release switch element is in an off state, the energy release circuit where the energy release switch element is located is not the lowest impedance loop. A laser diode in the energy release circuit where the energy release switch element is located does not emit light. Therefore, the present application can prevent the laser diode from emitting light at an unexpected time and improve a measurement performance of the LiDAR.

The person skilled in the art can understand that all or part of procedures in methods of the foregoing embodiments can be implemented by instructing relevant hardware via computer program. The program can be stored in a computer readable storage medium. During execution, the computer program can include the procedures of the embodiments of the foregoing methods. A storage medium can be a magnetic disk, an optical disc, the read-only storage memory or the random storage memory, and so on.

The disclosed foregoing are only preferred embodiments of the present application, which of course cannot be used to limit the scope of rights of the present application. Therefore, equivalent changes made in accordance with the claims of the present application still fall within the scope of the application.

What is claimed is:

1. A laser emitting circuit, comprising an energy charging circuit, an energy transfer circuit and a plurality of energy release circuits, the plurality of energy release circuits connected in parallel, wherein the energy charging circuit is connected to the energy transfer circuit and is configured to store electric energy;

the energy transfer circuit is connected to the energy charging circuit and the energy release circuits, and configured to transfer the electric energy stored in the energy charging circuit to the energy transfer circuit, and the energy transfer circuit comprises an energy storage capacitor and a floating-ground diode, wherein a first terminal of the energy storage capacitor is connected to the energy charging circuit, the first terminal of the energy storage capacitor is connected to the energy release circuits, a second terminal of the energy storage capacitor is grounded via the floating-ground diode, and the second terminal of the energy storage capacitor is connected to the energy release circuits;

each energy release circuit is configured to drive a laser diode to emit light using the electric energy stored in the energy transfer circuit, the energy release circuit comprises an energy release switch element, the laser diode and a clamping diode, wherein a first switch terminal of the energy release switch element is connected to the first terminal of the energy storage capacitor, a second switch terminal of the energy release switch element is connected to a positive electrode of the clamping diode, the second switch terminal of the energy release switch element is connected to a positive electrode of the laser diode, a negative electrode of the clamping diode is grounded, and a negative electrode of the laser diode is connected to the second terminal of the energy storage capacitor.

2. The laser emitting circuit according to claim 1, wherein the energy transfer circuit further comprises a boost rectifier diode, a positive electrode of the boost rectifier diode connected to the energy charging circuit, and a negative electrode of the boost rectifier diode connected to the first terminal of the energy storage capacitor.

3. The laser emitting circuit according to claim 1, wherein the energy release switch element is a bipolar junction transistor (BJT), wherein a collector of the BJT is connected to the first terminal of the energy storage capacitor, an emitter of the BJT is connected to the positive electrode of the clamping diode, the emitter of the BJT is connected to the positive electrode of the laser diode, and a base of the BJT is connected to a pulse generator as an enabling terminal; or the energy release switch element is a BJT, wherein an emitter of the BJT is connected to the first terminal of the energy storage capacitor, a collector of the BJT is connected to the positive electrode of the clamping diode, the collector of the BJT is connected to the positive electrode of the laser diode, and a base of the BJT is connected to the pulse generator as an enabling terminal; or the energy release switch element is a Metal-Oxide-Semiconductor Field-Effect Transistor (MOSFET), wherein a source of the MOSFET is connected to the first terminal of the energy storage capacitor, a drain of the MOSFET is connected to the positive electrode of the clamping diode, the drain of the MOSFET is connected to the positive electrode of the laser diode, and a gate of the MOSFET is connected to the pulse generator as an enabling terminal; or the energy release switch element is a MOSFET, wherein a drain of the MOSFET is connected to the first terminal of the energy storage capacitor, a source of the MOSFET is connected to the positive electrode of the clamping diode, the source of the MOSFET is connected to the positive electrode of the laser diode, and a gate of the MOSFET is connected to the pulse generator as an enabling terminal.

4. The laser emitting circuit according to claim 1, wherein the energy charging circuit comprises a power supply, a decoupling capacitor, an inductor, and an energy charging switch element, wherein a negative electrode of the power supply is grounded, a positive electrode of the power supply is grounded via the decoupling capacitor, the positive electrode of the power supply is connected to a first terminal of the inductor, a second terminal of the inductor is grounded via the energy charging switch element, and the second terminal of the inductor is connected to the first terminal of the energy storage capacitor.

5. The laser emitting circuit according to claim 4, wherein the energy charging switch element is a BJT, bipolar junction transistor, wherein a collector of the BJT is connected to the first terminal of the energy storage capacitor, an emitter of the BJT is connected to the positive electrode of the clamping diode, the emitter of the BJT is connected to the positive electrode of the laser diode, and a base of the BJT is connected to a pulse generator as an enabling terminal; or the energy charging switch element is a BJT, wherein an emitter of the BJT is connected to the first terminal of the energy storage capacitor, a collector of the BJT is connected to the positive electrode of the clamping diode, the collector of the BJT is connected to the positive electrode of the laser diode, and a base of the BJT is connected to the pulse generator as an enabling terminal; or the energy charging switch element is a Metal-Oxide-Semiconductor Field-Effect Transistor (MOSFET), wherein a source of the MOSFET is connected to the first terminal of the energy storage capacitor, a drain of the MOSFET is connected to the positive electrode of the clamping diode, the drain of the MOSFET is connected to the positive electrode of the laser diode, and a gate of the MOSFET is connected to the pulse generator as an enabling terminal; or the energy charging switch element is a MOSFET, wherein a drain of the MOSFET is connected to the first terminal of the energy storage capacitor, a source of the MOSFET is connected to the positive electrode of the clamping diode, the source of the MOSFET is connected to the positive electrode of the laser diode, and a gate of the MOSFET is connected to the pulse generator as an enabling terminal.

6. The laser emitting circuit according to claim 1, wherein the energy release circuit further comprises a dynamic compensation capacitor, a first terminal of the dynamic compensation capacitor connected to the first switch terminal of the energy release switch element, and a second terminal of the dynamic compensation capacitor connected to the second switch terminal of the energy release switch element.

7. The laser emitting circuit according to claim 6, wherein a capacitance value of the dynamic compensation capacitor is smaller than a capacitance value of the energy storage capacitor.

8. The laser emitting circuit according to claim 1, wherein the energy storage capacitor comprises a plurality of capacitors connected in parallel.

9. The laser emitting circuit according to claim 1, wherein the clamping diode and the floating-ground diode are Schottky diodes.

10. A LiDAR, comprising a laser emitting circuit according to claim 1.

* * * * *